(12) United States Patent
Thurgood

(10) Patent No.: US 7,084,489 B2
(45) Date of Patent: Aug. 1, 2006

(54) COMPUTER SYSTEM INCLUDING AT LEAST ONE STRESS BALANCED SEMICONDUCTOR PACKAGE

(75) Inventor: Blaine J. Thurgood, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/921,650

(22) Filed: Aug. 18, 2004

(65) Prior Publication Data

US 2005/0018515 A1   Jan. 27, 2005

Related U.S. Application Data

(60) Continuation of application No. 10/636,332, filed on Aug. 6, 2003, now Pat. No. 6,855,574, which is a division of application No. 10/227,329, filed on Aug. 23, 2002, now Pat. No. 6,696,748.

(51) Int. Cl.
*H01L 23/495* (2006.01)
*H01L 23/48* (2006.01)
*H01L 23/52* (2006.01)
*H01L 29/40* (2006.01)

(52) U.S. Cl. .................. 257/669; 257/668; 257/690; 257/738

(58) Field of Classification Search ............ 257/668, 257/669, 676, 686, 690, 704, 731, 738
See application file for complete search history.

(56) References Cited

U.S. PATENT DOCUMENTS

| | | | |
|---|---|---|---|
| 4,887,148 A | 12/1989 | Mu | |
| 5,627,407 A | 5/1997 | Suhir et al. | |
| 5,834,848 A | 11/1998 | Iwasaki | |
| 5,900,675 A | 5/1999 | Appelt et al. | |
| 5,901,041 A | 5/1999 | Davies et al. | |
| 6,258,624 B1 | 7/2001 | Corisis | |
| 6,291,899 B1 | 9/2001 | Wensel et al. | |
| 6,294,831 B1 | 9/2001 | Shishido et al. | |
| 6,316,829 B1 | 11/2001 | Boon et al. | |
| 6,384,487 B1 | 5/2002 | Smith | |
| 6,693,363 B1 * | 2/2004 | Tay et al. | 257/780 |
| 2004/0169278 A1 * | 9/2004 | Kinsman | 257/737 |
| 2004/0207064 A1 * | 10/2004 | Brooks et al. | 257/678 |
| 2005/0127531 A1 * | 6/2005 | Tay et al. | 257/786 |
| 2005/0164429 A1 * | 7/2005 | Kinsman et al. | 438/113 |
| 2005/0186705 A1 * | 8/2005 | Jackson et al. | 438/106 |

* cited by examiner

*Primary Examiner*—Ngân V. Ngô
(74) *Attorney, Agent, or Firm*—TraskBritt

(57) ABSTRACT

Stress balanced semiconductor device packages, a method of forming, and a method of modifying a mold segment for use in the method are disclosed. A semiconductor die is attached to one side of a substrate having discrete conductive elements such as a ball grid array (BGA) on the opposing side thereof. An envelope of encapsulant material is disposed over the semiconductor die on one side of the substrate while a stress balancing structure comprising at least one stem member and at least one transversely extending branch member formed of encapsulant material is disposed over the opposing side of the substrate in an arrangement which does not interfere with the discrete conductive elements. The envelope and the stress balancing structure may be simultaneously formed.

22 Claims, 8 Drawing Sheets

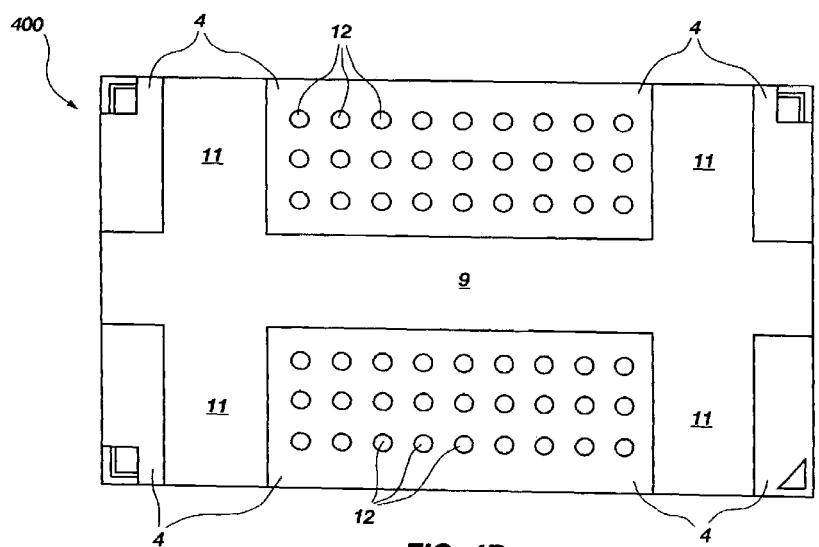
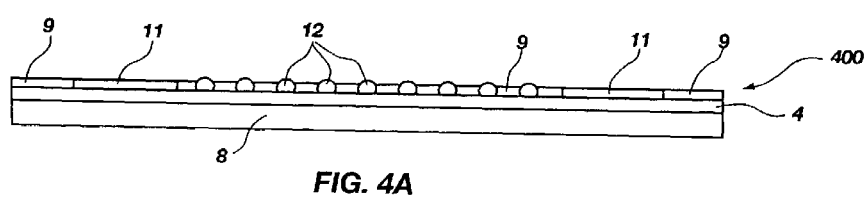
FIG. 4B
FIG. 4E
FIG. 4A

COMPUTER SYSTEM INCLUDING AT LEAST ONE STRESS BALANCED SEMICONDUCTOR PACKAGE

CROSS-REFERENCE TO RELATED APPLICATIONS

This application is a continuation of application Ser. No. 10/636,332, filed Aug. 6, 2003, now U.S. Pat. No. 6,855,574, issued Feb. 15, 2005, which is a divisional of application Ser. No. 10/227,329, filed Aug. 23, 2002, now U.S. Pat. No. 6,696,748, issued Feb. 24, 2004.

BACKGROUND OF THE INVENTION

1. Field of the Invention

The present invention relates to the packaging of electronic components such as integrated circuits or other electronic devices. In particular, this invention relates to an improved semiconductor device package wherein at least one semiconductor die is encapsulated on a substrate and another volume of encapsulant material is added to the opposing side of the substrate in a configuration to assist in control of the stresses in the package.

2. State of the Art

Conventionally, semiconductor dice have been packaged in plastic or, less commonly, in ceramic packages. Packages may support, protect, and dissipate heat from semiconductor dice. Packages may also provide external connective elements for providing power and signal distribution to and from semiconductor dice, as well as for facilitating electrical testing, such as burn-in testing and circuit evaluation, of semiconductor dice prior to or after assembly thereof with higher-level components, such as carrier substrates or circuit boards.

FIG. 1A schematically illustrates a section of a conventional board-on-chip (BOC) semiconductor device assembly 100A with electrical contacts which conventionally comprise a ball grid array (BGA) of discrete conductive elements 12 such as solder balls. FIG. 1A shows substrate 4, typically a printed circuit board, mounted to semiconductor die 2. Semiconductor die 2 is placed in electrical communication with substrate 4 by bond wires 6 extending between bond pads 3 of semiconductor die 2 and terminal pads 5 through slot 7 in substrate 4 using conventional wire bonding techniques. Both semiconductor die 2 and bond wires 6 are encapsulated in a transfer molded, filled polymer volume of encapsulant material shown by die encapsulation region 8 and wire bond cap 10. FIG. 1B illustrates a side view and FIG. 1C illustrates a plan view of the semiconductor device assembly 100A of FIG. 1A.

FIG. 2A schematically illustrates a conventional chip-on-board (COB) assembly 200A fabricated using conventional wire bonding techniques. FIG. 2B shows a flip-chip configured semiconductor device assembly 200B that utilizes solder bumps 14 instead of wire bonds to electrically connect semiconductor die 2 to substrate 4.

A semiconductor die, the encapsulation material, the adhesives or other bonding agents used to connect the semiconductor die to the substrate, the substrate, and the electrical connection mechanisms between the semiconductor die and the substrate of a semiconductor device assembly are usually each made from a different material or combination of materials. These different materials usually have different thermomechanical properties due to differing coefficients of thermal expansion (CTE), which differences result in stresses developing during manufacture or use of the semiconductor device assembly, the latter due to thermal cycling. Several problems can result during manufacture and use of semiconductor device assemblies due to the development of these thermomechanical-related stresses. For instance, bowing of the semiconductor device assembly can occur due to internal bending stresses, causing cracking in the encapsulant materials and subjecting components to environmental degradation, debonding of the semiconductor die from the substrate, solder joint failure, or cracking in the substrate itself. Even if minimal bowing is manifested initially, residual tensile stresses can still be present, eventually resulting in the same problems after a period of time due to thermal cycling-induced fatigue experienced during normal operation.

Residual tensile stresses develop during manufacture from the aforementioned mismatch of material CTEs, as well as from shrinkage of the encapsulation material during curing and hardening thereof. FIG. 3 shows an exaggerated view of bowing in a wire bonded BOC assembly 100A as previously depicted in FIG. 1A due to the thermomechanical stresses. The bowing occurs in significant part due to the imbalance of the volume of encapsulant material between the two opposing sides of substrate 4. As shown in FIG. 3, there is significantly more encapsulant material volume present in die encapsulation region 8 than in wire bond cap 10. Further, die encapsulation region 8 extends completely across substrate 4, while wire bond cap 10 runs primarily longitudinally over substrate 4, extending laterally only a sufficient distance to cover bond wires 6 and slot 7. The resulting predominant tensile stress developed near substrate 4 and on one side thereof due to shrinkage of the substantially different volumes and extents of the encapsulant material applied to the opposing sides of substrate 4 can cause significant problems with respect to package integrity. One particularly notable problem is cracking in wire bond cap 10, which exposes the wires to environmental degradation and may itself cause breakage of the thin, delicate bond wires 6.

The prior art has attempted to address the issues of undesirable stresses in semiconductor packaging. For example, U.S. Pat. No. 5,627,407 to Suhir et al. purportedly solves the problem of unwanted thermomechanical stresses by using a thin "surrogate layer" on the entire substrate side opposite the encapsulated semiconductor die. However, this method utilizes significantly more material in the surrogate layer than may be needed and involves the use of a different material than the encapsulant. Also, by covering an entire side of the substrate with the surrogate layer, it is difficult, if not impossible, to place discrete conductive elements, such as a BGA, on the substrate side bearing the surrogate layer. Further, adding this surrogate layer may be required to be performed as an additional process step. Little guidance is provided as to how the encapsulant and the surrogate layer might be applied concurrently, as is indicated by Suhir as being a desirable approach. In addition, placement of a surrogate layer proximate each substrate and prior to encapsulation will itself require additional cost and alignment considerations.

U.S. Pat. No. 6,294,831 to Shishido et al. attempts to reduce bowing in a flip-chip type semiconductor device assembly by bonding a structure over the back side of a flip-chip configured semiconductor die and on the opposing side of the semiconductor die to an interposer substrate to which the semiconductor die is mechanically secured and electrically connected, the structure having a CTE similar to that of the substrate.

U.S. Pat. No. 6,291,899 to Wensel et al. addresses bowing in a COB BGA semiconductor device assembly by applying a so-called stabilizing plate to a side of the substrate opposite that to which the semiconductor die is back side-attached and wire bonded. The stabilizing plate is formed of a rigid material different from that used to encapsulate the semiconductor die and is applied before the encapsulant is applied over the semiconductor die. Placement of the stabilizing plate on the side of the substrate carrying the discrete conductive elements of the BGA also requires fairly precise alignment of the stabilizing plate during placement.

Other U.S. Patents have addressed the issue of stresses in semiconductor packages but only with regard to bowing in lead frame assemblies. For example, U.S. Pat. No. 6,384,487 to Smith and U.S. Pat. No. 6,258,624 to Corisis attempt to equalize the volume of encapsulant material on both sides of a lead frame to minimize bowing. U.S. Pat. No. 6,316,829 to Boon et al. attempts to solve the same problem, but by molding grooves and ridges in an encapsulated lead frame.

While the prior art has attempted to address bowing and other stress-related problems in semiconductor device assemblies, a need exists for a semiconductor device assembly of a design whereby the stresses in the assembly can be controlled effectively while not requiring added process steps or the use of substantial additional materials, expensive materials or complex structural configurations, each of which increase fabrication cost. Further, it would be desirable to provide a semiconductor device assembly design which easily accommodates the use of a BGA for connection to higher-level packaging.

BRIEF SUMMARY OF THE INVENTION

The present invention provides a structural configuration which substantially balances stresses in semiconductor device assemblies through selective placement of encapsulant material on opposing sides of a substrate. The semiconductor device assembly includes at least one semiconductor die mounted to a substrate in either a board-on-chip (BOC) or chip-on-board (COB) configuration. Flip-chip, wire bonding, or any other technique known in the art may be used to electrically connect the semiconductor die to the substrate. The semiconductor die is attached and electrically connected to one side of a substrate with discrete conductive elements such as a ball grid array (BGA) on the opposing side of the substrate.

In a broad embodiment, at least one stem member and at least one transversely extending branch member may be placed on the side of a carrier substrate such as an interposer substrate opposite the side on which a semiconductor die and die encapsulation region extending over them are placed. The combined volumes of the stem and branch member may be substantially equal to the volume of the die encapsulation region.

One exemplary embodiment of the present invention comprises a wire bonded BOC semiconductor device assembly where the wire bonds extending between the bond pads of the semiconductor die and terminal pads of the substrate are encapsulated with a longitudinally extending wire bond cap in a conventional manner with at least one laterally extending branch member of encapsulant material formed over the same side of the substrate as the wire bond cap. The wire bond cap and at least one branch member may be formed simultaneously with an encapsulation region formed over the semiconductor die.

Another exemplary embodiment of the present invention comprises a wire bonded COB assembly wherein the semiconductor die and wire bonds are encapsulated on one side of the substrate and at least one additional longitudinally extending stem member having at least one laterally extending branch member of encapsulant material may be formed on the opposing side of the substrate and simultaneously with encapsulation of the semiconductor die and wire bonds.

Yet another exemplary embodiment of the present invention comprises a semiconductor device package wherein a flip-chip configured semiconductor die is attached and electrically connected to a substrate. The semiconductor die may be encapsulated on one side of the substrate simultaneously with application of encapsulant material to the opposing side of the substrate in a configuration providing at least one longitudinal member and at least one laterally extending member.

The present invention offers the advantage, among others, of reducing internal bending stresses on an encapsulated semiconductor device assembly by moving the neutral axis, where such bending stresses are slight to nonexistent, closer to or even within the center of the substrate. Further, the stress-balancing structures of the present invention are formed using an insubstantial volume of additional encapsulant material and simultaneously with molding of an encapsulant envelope over the semiconductor die and, if applicable, a wire bond cap.

The present invention also encompasses a method of making the above semiconductor packages and a method of modifying a mold segment for use in the method.

BRIEF DESCRIPTION OF THE SEVERAL VIEWS OF THE DRAWINGS

In the drawings, which illustrate what is currently considered to be the best mode for carrying out the invention and in which like elements and features are identified by like reference numerals:

FIG. 4A is a side elevation of a stress balanced semiconductor device assembly according to the present invention;

FIG. 4B is a plan view of the stress balanced semiconductor device assembly of FIG. 4A;

FIG. 4E is a side sectional view of a flip-chip semiconductor device assembly on an interposer substrate having an external configuration in accordance with FIGS. 4A and 4B;

DETAILED DESCRIPTION OF THE INVENTION

Figure 1A:
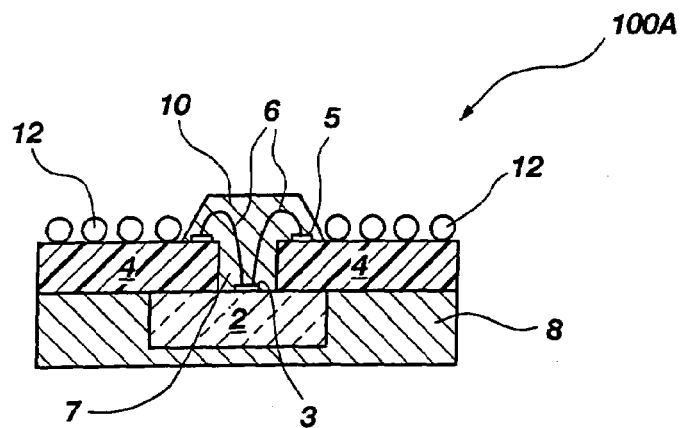
FIG. 1A is a schematic sectional view of a conventional BOC semiconductor device assembly utilizing wire bonding.
Figure 2A:
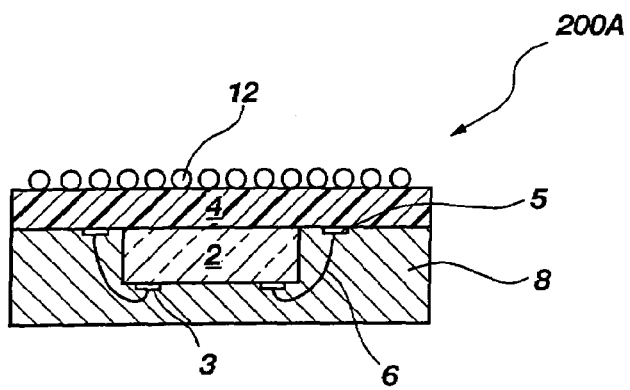
FIG. 2A is a schematic sectional view of a conventional COB semiconductor device assembly utilizing wire bonding.
Figure 2B:
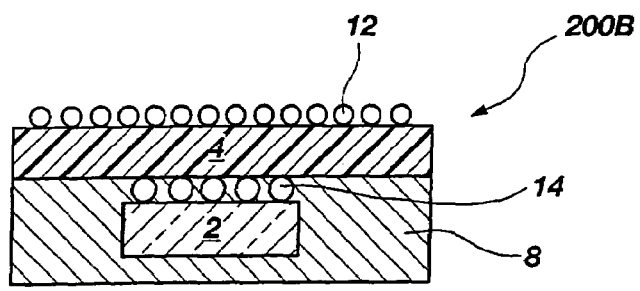
FIG. 2B is a schematic sectional view of a conventional COB semiconductor device utilizing a flip-chip configured die.
Figure 1C:
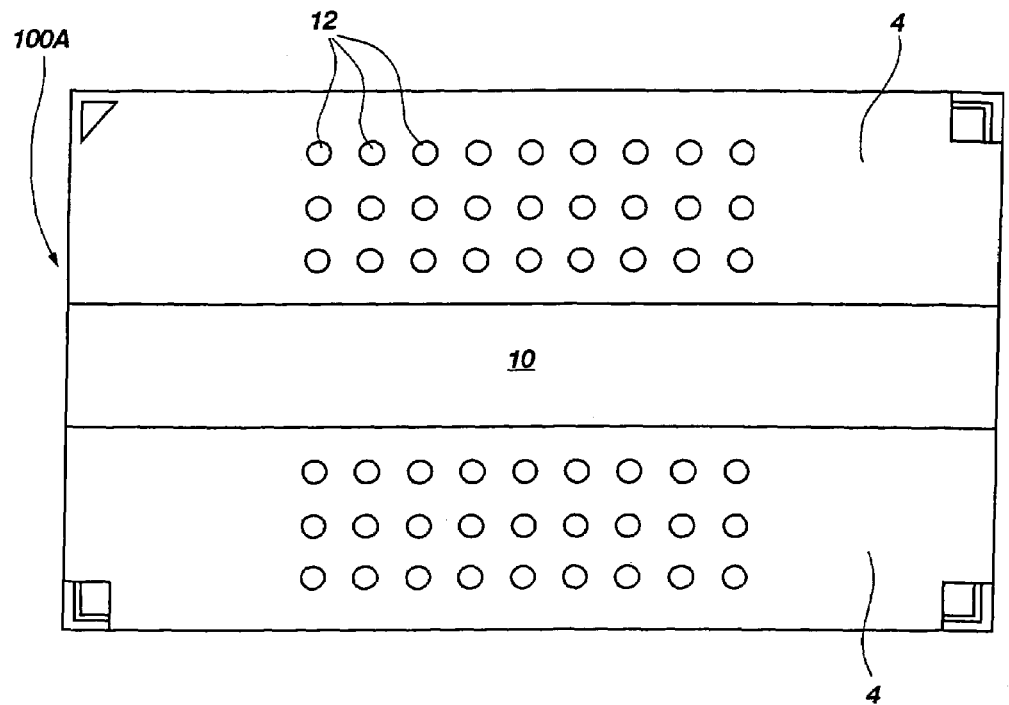
FIG. 1C is a plan view of the conventional BOC semiconductor device assembly of FIG. 1B.
Figure 1B:
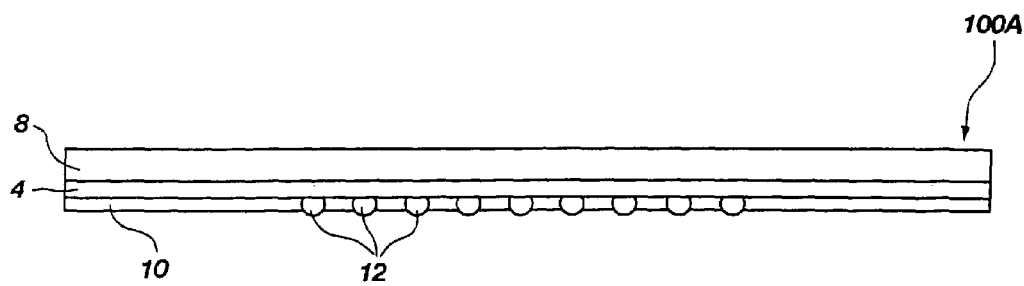
FIG. 1B is a side elevation of a conventional BOC semiconductor device assembly utilizing wire bonding.
Figure 3:
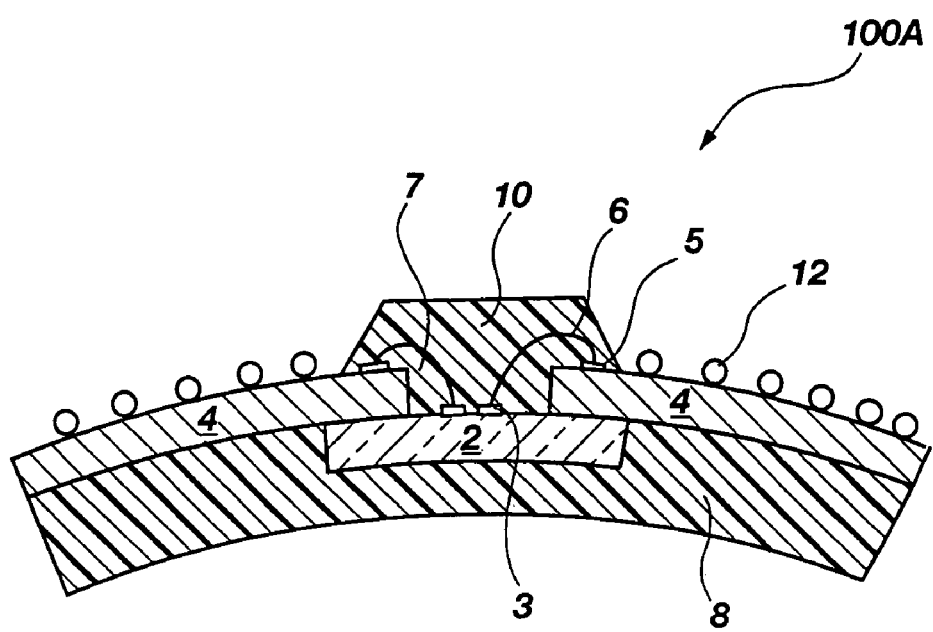
FIG. 3 is a schematic sectional view of the semiconductor device assembly of FIG. 1A bowed under stress.

Referring to FIGS. 4A–4E, at least one semiconductor die 2 is mounted by conventional methods such as adhesive or other bonding agent (and, in some instances, by a flip-chip connection) to form either a chip-on-board (COB) or board-on-chip (BOC) assembly with substrate 4. Substrate 4 may be a printed circuit board formed, for example, of BT resin or comprising an FR-4 or FR-5 laminate, a ceramic substrate, a silicon substrate, a flexible circuit board, or any other type of rigid or flexible circuit board material known to one of ordinary skill in the art. Semiconductor die 2 is encapsulated with a material as shown by die encapsulation region 8 On a first side of substrate 4. Discrete conductive elements 12 are provided on the side of substrate 4 opposite semiconductor die 2. Discrete conductive elements 12 may be arranged in a ball grid array or other suitable configuration for mechanically and electrically connecting the semiconductor device assembly to higher-level packaging.

In one embodiment, as shown in FIGS. 4A and 4B, an assembly 400 is used where a stem member 9 and at least one branch member 11 extending from stem member 9 are provided adjacent to discrete conductive elements 12. Stem member 9 extends in a longitudinal direction and branch member 11 extends in a transverse direction. FIG. 4B shows a preferred geometry where stem member 9 extends longitudinally between two portions of an array of discrete conductive elements 12 and two branch members 11 extend in a transverse direction at each end of the array of discrete conductive elements 12. Further and as shown, stem member 9 and branch member 11 may be substantially perpendicular to each other. In one embodiment, stem member 9 and branch member 11 are formed at the same time and form an integral structure.

Figure 4C:
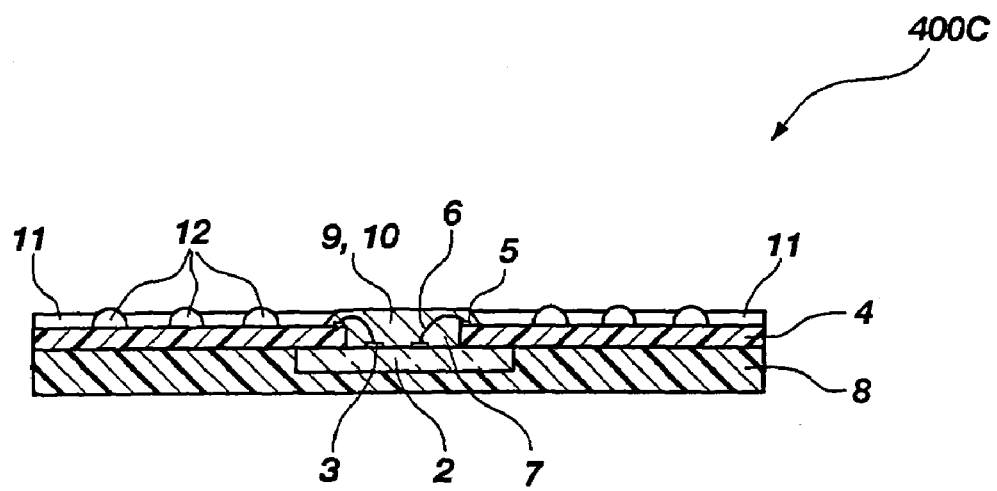
FIG. 4C is a side sectional view of a wire bonded BOC stress balanced semiconductor device assembly having an external configuration in accordance with FIGS. 4A and 4B.

In an exemplary embodiment as shown in FIG. 4C employing the external configuration shown in FIGS. 4A and 4B, a BOC assembly 400C is used where semiconductor die 2 is electrically connected to substrate 4 using bond wires 6. Bond wires 6 are extended between bond pads 3 of semiconductor die 2 and terminal pads 5 of substrate 4 through slot 7 using conventional wire bonding techniques known to one skilled in the art. As in the other exemplary embodiments, substrate 4 may be a printed circuit board, flexible circuit board, or any other type of circuit board known to one skilled in the art. Discrete conductive elements 12 are provided on the side of substrate 4 opposite semiconductor die 2. Discrete conductive elements 12 may comprise an array such as a BGA. Semiconductor die 2 is encapsulated by die encapsulation region 8. Bond wires 6 are encapsulated by a wire bond cap 10 which, according to the present invention, also comprises a longitudinally extending stem member 9 along substrate 4 adjacent to and between two portions of the array of discrete conductive elements 12. At least one branch member 11 may extend in a direction substantially transverse to stem member 9 and laterally across substrate 4. Two branch members 11 may respectively lie preferably on opposing sides of discrete conductive elements 12. In this embodiment, combined wire bond cap 10 and stem member 9 and contiguous branch members 11 are preferably formed at the same time and simultaneously with formation of die encapsulation region 8 to form an integral assembly. It is also currently preferred that wire bond cap 10/stem member 9, branch members 11 and die encapsulation region 8 be formed in a transfer molding process wherein a molten, silicon-filled thermoplastic polymer dielectric mold compound is molded about the BOC assembly 400C in a transfer mold.

Such a transfer mold may comprise two mold segments, one configured with a mold cavity to form die encapsulation region 8 and the opposing one configured to define wire bond cap 10/stem member 9 and branch members 11. Both mold segments will, of course, sealingly engage a surface of substrate 4 to preclude mold compound bleeding onto unwanted areas of substrate 4. It should be noted that the embodiments shown in FIGS. 4A–4F have the advantage of not having to introduce additional process steps since bond wires 6 are typically encapsulated in conventional BOC wire bonded assemblies (i.e., a wire bond cap 10) simultaneously with die encapsulation region 8 and, in the other embodiments, an appropriate mold segment may be configured and employed in the molding process already in use.

The modification of an existing mold segment defining the wire bond cap 10/longitudinal stem member 9 in the embodiment of FIG. 4C to include mold cavity portions to define laterally extending branch members 11 configured as shown in FIG. 4B may be easily effected using, for example, a milling machine or electrodischarge machining (EDM), among other techniques. Of course, additional runners and vents may be added to the mold segment as desired or required. Accordingly, once the mold segment is so modified, the only additional cost in the BOC assembly encapsulation process is the minimal cost of the additional mold compound used to define the branch members 11. Of course, a transfer molding mold is normally configured for molding of a large number of semiconductor device assemblies and the mold segments used to define wire bond cap 10/stem member 9 for each of such assemblies may be modified to the configuration of the present invention.

Figure 4D:
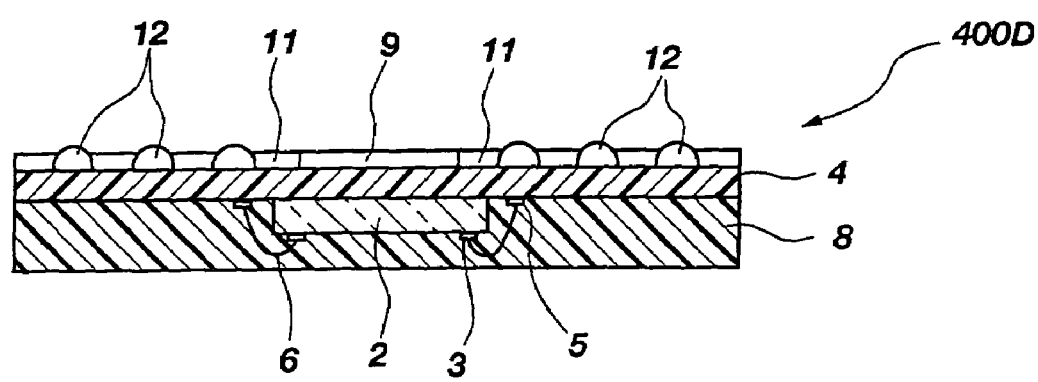
FIG. 4D is a side sectional view of a wire bonded COB stress balanced semiconductor device assembly having an external configuration in accordance with FIGS. 4A and 4B.
Figure 4F:
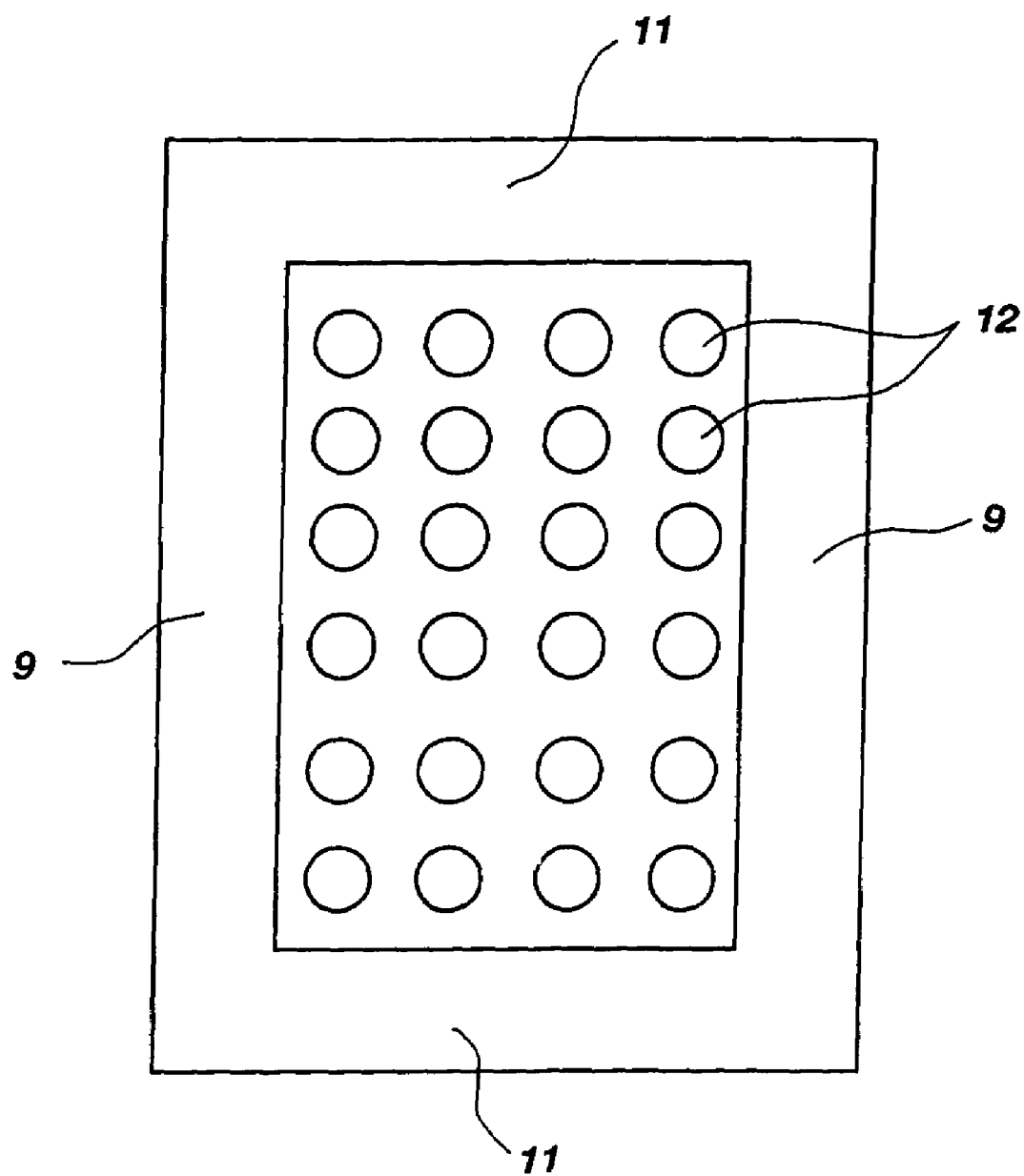
FIG. 4F is a plan view of another external configuration of a stress balanced semiconductor device assembly suitable for use with the COB semiconductor device assemblies of FIGS. 4D and 4E.

FIG. 4D depicts a COB assembly 400D in accordance with the present invention, wherein semiconductor die 2 is back-bonded to carrier substrate 4, and die encapsulation region 8 extends over bond wires 6 facing away from substrate 4. Discrete conductive elements 12 are operably coupled to bond wires 6 through vias and, if desired or required, a redistribution layer (RDL) extending over a surface of substrate 4 or redistribution traces extending therewithin. Longitudinal stem member 9 and branch members 11 are arranged as depicted in FIG. 4B, although this arrangement is not required. For example, stem member 9 may be eliminated and one or more branch members 11 used alone. Alternatively, as shown in FIG. 4F, two longitudinal stem members 9 may be placed along parallel, opposing edges of substrate 4, with branch members 11 placed along parallel, opposing edges of substrate 4 oriented perpendicular to the other two edges, stem members 9 and branch members 11 framing an array wherein a BGA of discrete conductive elements 12 may be placed. Thus, a mold segment configured to achieve the foregoing stem member 9 and branch member 11 configuration would be placed against the side of substrate 4 opposite to semiconductor die 2.

FIG. 4E shows a COB assembly 400E using a flip-chip type semiconductor die 2 having solder bumps 14 or other discrete conductive elements extending from an active surface of semiconductor die 2 to mechanically and electrically connect semiconductor die 2 to substrate 4. As with the other embodiments, the BGA side of substrate 4 may be configured as depicted in FIG. 4B or 4F.

In all embodiments shown in FIGS. 4A–4F, the resulting neutral axis of the semiconductor package is preferably located to be at least near, if not coincident with, the center of substrate 4. That is to say, while the substrate extends primarily in the X-Y plane, it also has a depth or thickness transverse to the X-Y plane which is commonly referenced as the "Z" dimension of the substrate. Thus, the present invention desirably places the neutral axis, or location wherein internal bending stresses are neglible or nonexistent, within the center of the substrate 4. This design has the advantage of substantially lowering or even eliminating tensile stresses near the substrate 4, reducing the tendency of the semiconductor package to bow, reducing the tendency of cracking in stem member 9, and eliminating or reducing the tendency of the assembly to exhibit the aforementioned sructural problems. Stem member or members 9 and branch members or member 11 may also provide additional structural support for the semicoductor package.

Further, in all embodiments shown by FIGS. 4A–4F, die encapsulation region 8, stem member 9, and branch member or members 11 may be formed from materials known in the art and the encapsulant material used may be the same for both sides of substrate 4. For example, polymers such as epoxies, silicones, silicone-carbon resins (SYNCAR™), polyimides, or polyurethanes may be used. Composite materials such as reinforced polymers may also be selected for die encapsulation region 8, stem member 9, and branch member 11. Die encapsulation region 8, stem member 9, and branch member or members 11 may be formed from molding techniques known in the art other than transfer molding, including, for example, pot molding and injection molding. Other methods and materials to produce die encapsulation region 8, stem member 9, and branch member 11 will be readily apparent to those of ordinary skill in the art.

It will also be appreciated that the present invention provides, through the presence of at least one stem member and at least one branch member, a stabilizing structure for the BGA and a standoff for discrete conductive elements 12 thereof.

Figure 5:
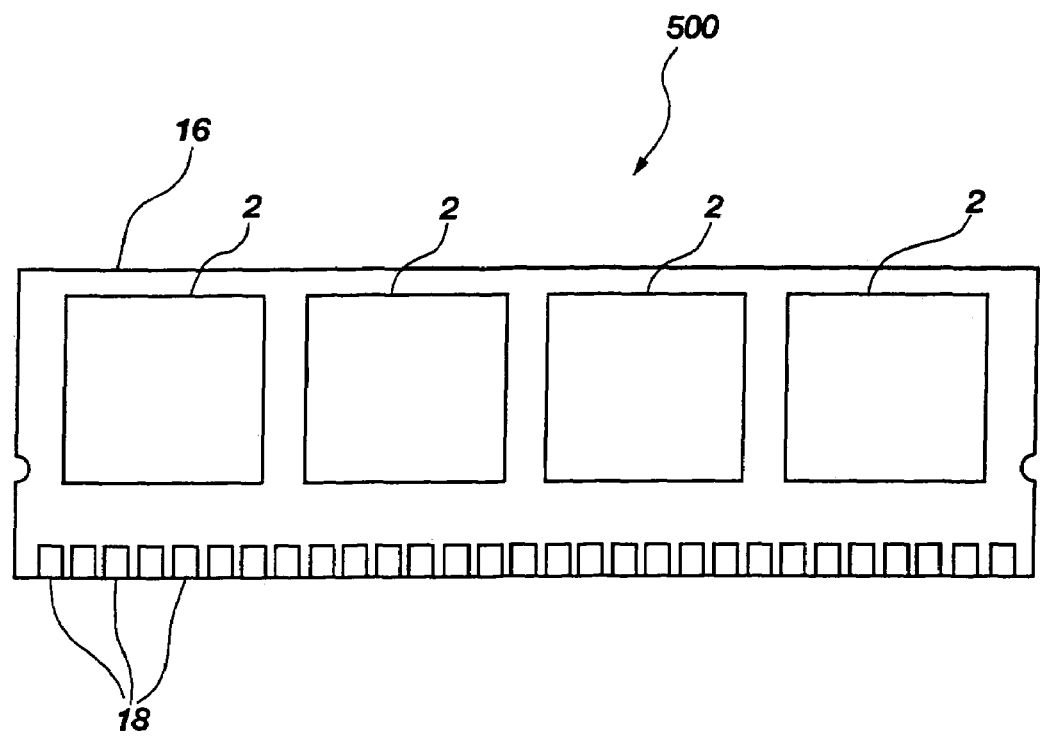
FIG. 5 is a schematic elevation of a memory module including a plurality of stress balanced semiconductor device assemblies according to the present invention.

Referring now to FIG. 5, a memory device or module 500 is shown which incorporates a plurality of semiconductor dice 2 packaged according to the present invention. The memory device 500 includes a printed circuit board 16 to which the one or more packaged semiconductor dice 2 may be mechanically and electrically operably coupled therewith to form the memory device or module 500. A plurality of electrical edge connectors 18 may be formed on the printed circuit board 16 to provide input and output connections from an external device, such as, for example, a motherboard of a computer, to the one or more semiconductor dice 2.

Figure 6:
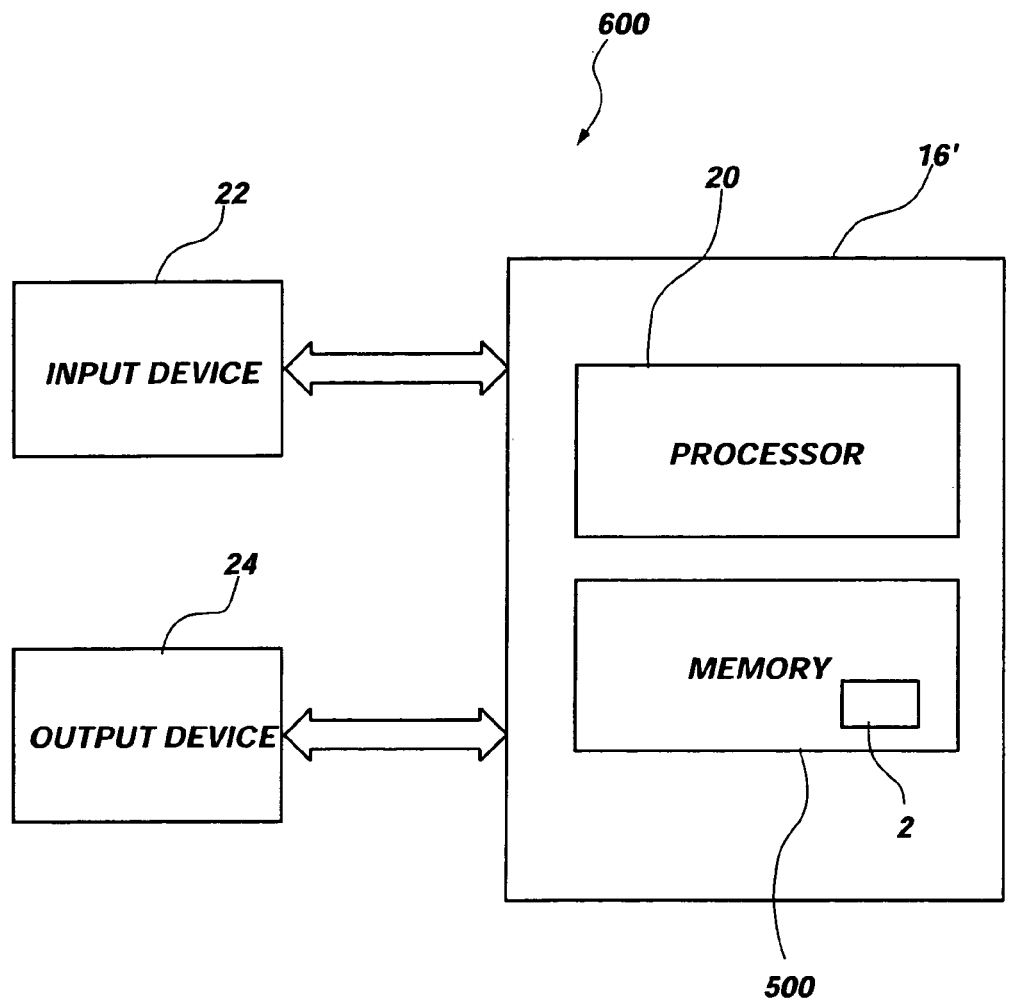
FIG. 6 is a computer system including at least one stress balanced semiconductor device assembly according to the present invention.

Referring now to FIG. 6, a computer system 600 is shown which includes a printed circuit board 16' such as, for example, a motherboard. The printed circuit board 16' may be operably coupled to at least one processor 20, such as, for example, a central processing unit, (CPU) and at least one memory device 500. The memory device 500 may include one or more semiconductor dice 2 packaged as described above in the present invention. The printed circuit board46 16' is operably coupled with at least one input device 22 such as, for example, a keyboard, a mouse, a sensor or another computing device. The printed circuit board 16' is also operably coupled with at least one output device 24 such as, for example, a printer, a monitor, an actuator or another computing device.

Although the foregoing description contains many specifics, these are not to be construed as limiting the scope of the present invention, but merely as providing certain exemplary embodiments. Similarly, other embodiments of the invention may be devised which do not depart from the spirit or scope of the present invention. The scope of the invention is, therefore, indicated and limited only by the appended claims and their legal equivalents, rather than by the foregoing description. All additions, deletions, and modifications to the invention, as disclosed herein, which fall within the meaning and scope of the claims are encompassed by the present invention.

What is claimed is:

1. A computer system comprising:
    a printed circuit board;
    a processor operably coupled to the printed circuit board;
    at least one input device operably coupled to the printed circuit board;
    at least one output device operably coupled to the printed circuit board; and
        at least one memory device operably coupled to the printed circuit board, the at least one memory device comprising:
        a substrate;
        at least one semiconductor die disposed on a first side of the substrate;
        a plurality of discrete conductive elements disposed on an opposing side of the substrate and operably coupled to the at least one semiconductor die;
        an encapsulation region extending over the at least one semiconductor die; and
        at least one stem member and at least one branch member extending substantially transversely to the at least one stem member, the at least one stem member and the at least one branch member disposed on the opposing side of the substrate.

2. The computer system of claim 1, wherein the at least one memory device comprises a plurality of memory devices.

3. The computer system of claim 2, wherein the plurality of memory devices is configured as a memory module.

4. The computer system of claim 1, wherein the at least one stem member and the at least one branch member are substantially perpendicular to each other.

5. The computer system of claim 1, wherein the at least one stem member and the at least one branch member are substantially contiguous.

6. The computer system of claim 1, wherein the at least one stem member is disposed between portions of the plurality of discrete conductive elements and the at least one branch member is disposed at an end of the plurality of discrete conductive elements.

7. The computer system of claim 6, wherein the at least one branch member comprises two branch members, each disposed at an end of the plurality of discrete conductive elements.

8. The computer system of claim 1, wherein the at least one stem member is disposed at one side of the plurality of discrete conductive elements and the at least one branch member is disposed at an end of the plurality of discrete conductive elements.

9. The computer system of claim 1, wherein the at least one stem member comprises two stem members, each disposed at one side of the plurality of discrete conductive elements and the at least one branch member comprises two branch members, each disposed at one end of the plurality of discrete conductive elements.

10. The computer system of claim 1, wherein the at least one stem member and the at least one branch member are made from a polymer material.

11. The computer system of claim 10, wherein the polymer material comprises a silicon particle-filled thermoplastic polymer.

12. The computer system of claim 10, wherein the polymer material is selected from the group consisting of epoxies, silicones, silicone-carbon resins, polyimides, and polyurethanes.

13. The computer system of claim 10, wherein the die encapsulation region is formed of the same polymer material as the at least one stem member and the at least one branch member.

14. The computer system of claim 1, wherein the at least one semiconductor die includes an active surface facing the substrate.

15. The computer system of claim 1, wherein the at least one semiconductor die includes an active surface facing away from the substrate.

16. The computer system of claim 1, wherein the at least one semiconductor die is operably coupled to the plurality of discrete conductive elements at least partially through bond wires.

17. The computer system of claim 16, wherein the bond wires extend through a slot in the substrate.

18. The computer system of claim 1, wherein the at least one memory device includes a neutral axis at least proximate to a center of the substrate.

19. The computer system of claim 18, wherein the neutral axis lies substantially in a plane of the substrate.

20. The computer system of claim 1, wherein the at least one stem member is substantially longitudinally oriented on the substrate and the at least one branch member is substantially laterally oriented on the substrate.

21. The computer system of claim 1, wherein a volume of material of the encapsulation region and combined volumes of the at least one stem member and the at least one branch member are substantially equal.

22. The computer system of claim 1, wherein the at least one stem member comprises a wire bond cap.

* * * * *

UNITED STATES PATENT AND TRADEMARK OFFICE
CERTIFICATE OF CORRECTION

| | | |
|---|---|---|
| PATENT NO. | : 7,084,489 B2 | Page 1 of 1 |
| APPLICATION NO. | : 10/921650 | |
| DATED | : August 1, 2006 | |
| INVENTOR(S) | : Blaine J. Thurgood | |

It is certified that error appears in the above-identified patent and that said Letters Patent is hereby corrected as shown below:

COLUMN 7, LINE 66, change "circuit board46" to --circuit board--

Signed and Sealed this

Fourth Day of September, 2007

JON W. DUDAS
*Director of the United States Patent and Trademark Office*